United States Patent
Hwang et al.

(10) Patent No.: US 9,345,130 B2
(45) Date of Patent: May 17, 2016

(54) CONDUCTIVE SUBSTRATE COMPRISING CONDUCTIVE PATTERN AND TOUCH PANEL COMPRISING SAME

(71) Applicant: LG CHEM, LTD., Seoul (KR)

(72) Inventors: Ji Young Hwang, Daejeon (KR); In-Seok Hwang, Daejeon (KR); Seung Heon Lee, Daejeon (KR); Sang Ki Chun, Daejeon (KR); Beom Mo Koo, Daejeon (KR)

(73) Assignee: LG CHEM, LTD., Seoul (KR)

(*) Notice: Subject to any disclaimer, the term of this patent is extended or adjusted under 35 U.S.C. 154(b) by 0 days.

(21) Appl. No.: 13/973,657

(22) Filed: Aug. 22, 2013

(65) Prior Publication Data
US 2014/0144679 A1 May 29, 2014

Related U.S. Application Data

(63) Continuation of application No. PCT/KR2012/007803, filed on Sep. 27, 2012.

(30) Foreign Application Priority Data

Sep. 27, 2011 (KR) .................. 10-2011-0097756

(51) Int. Cl.
| | |
|---|---|
| *H05K 3/12* | (2006.01) |
| *H05K 1/02* | (2006.01) |
| *H05K 1/03* | (2006.01) |
| *G06F 3/047* | (2006.01) |
| *H05K 1/09* | (2006.01) |
| *H05K 3/10* | (2006.01) |

(52) U.S. Cl.
CPC .............. *H05K 1/0274* (2013.01); *G06F 3/047* (2013.01); *H05K 1/03* (2013.01); *H05K 1/092* (2013.01); *H05K 3/10* (2013.01); *H05K 3/1275* (2013.01); *G06F 2203/04103* (2013.01); *G06F 2203/04112* (2013.01)

(58) Field of Classification Search
CPC ......... H05K 1/0274; H05K 1/03; H05K 3/10; H05K 3/1275; G06F 3/047
USPC ........................................... 174/250
See application file for complete search history.

(56) References Cited

U.S. PATENT DOCUMENTS

| | | | |
|---|---|---|---|
| 2006/0097991 A1* | 5/2006 | Hotelling et al. | ............. 345/173 |
| 2009/0107736 A1 | 4/2009 | Ben-Eliyahu et al. | |

(Continued)

FOREIGN PATENT DOCUMENTS

| | | |
|---|---|---|
| JP | 10-2006-344163 A | 12/2006 |
| JP | 2006-344163 A | 12/2006 |

(Continued)

*Primary Examiner* — Hoa C Nguyen
*Assistant Examiner* — Amol Patel
(74) *Attorney, Agent, or Firm* — Dentons US LLP

(57) ABSTRACT

The present invention relates to a conductive substrate comprising a conductive pattern having an improved concealment property and a touch panel comprising the same, and the conductive substrate according to the present invention comprises: a transparent substrate, and a conductive pattern comprising a conductive line provided on the transparent substrate, wherein the conductive pattern comprises two or more conductive lines spaced from each other in a longitudinal direction of the conductive line, and a distance between nearest-adjacent ends of two or more conductive lines spaced from each other is 15 μm or less. The conductive substrate according to the present invention can more efficiently conceal a metal line comprised in the conductive pattern.

14 Claims, 12 Drawing Sheets

(56) References Cited

U.S. PATENT DOCUMENTS

| | | | |
|---|---|---|---|
| 2009/0218310 A1* | 9/2009 | Zu et al. | 216/11 |
| 2010/0156840 A1* | 6/2010 | Frey et al. | 345/174 |
| 2010/0182254 A1 | 7/2010 | Lee et al. | |
| 2012/0031746 A1* | 2/2012 | Hwang et al. | 200/5 A |

FOREIGN PATENT DOCUMENTS

| | | | |
|---|---|---|---|
| JP | 2006344163 A * | 12/2006 | |
| JP | 2011-029175 A | 2/2011 | |
| JP | 2011029175 A * | 2/2011 | |
| JP | 2011-517355 A | 6/2011 | |
| JP | 2011-517367 A | 6/2011 | |
| KR | 10-2010-0084262 A | 7/2010 | |
| KR | 10-2010-0091497 A | 8/2010 | |
| KR | 1020100091497 A | 8/2010 | |
| KR | 10-2011-0045800 A | 5/2011 | |
| KR | 1020110045800 A | 5/2011 | |
| TW | 201039002 A | 11/2010 | |
| WO | 2009/108758 A2 | 9/2009 | |
| WO | 2010-090487 A2 | 8/2010 | |
| WO | WO 2010090487 A2 * | 8/2010 | |

* cited by examiner

CONDUCTIVE SUBSTRATE COMPRISING CONDUCTIVE PATTERN AND TOUCH PANEL COMPRISING SAME

This application is a bypass continuation application of International Application No. PCT/KR2012/007803, filed Sep. 27, 2012, which claims priority to Korean Patent Application No. 10-2011-0097756, filed on Sep. 27, 2011 in the Korean Intellectual Property Office, both of which are incorporated herein by reference.

TECHNICAL FIELD

The present invention relates to a conductive substrate comprising a conductive pattern and a touch panel comprising the same.

BACKGROUND ART

In general, a display device refers to monitors for a TV or a computer as a whole, and comprises a display device forming an image and a case supporting the display device.

Examples of the display device may comprise a plasma display panel (PDP), a liquid crystal display (LCD), an electrophoretic display, and a cathode-ray tube (CRT). An RGB pixel pattern for implementing an image and an additional optical filter may be provided in the display device.

The optical filter may comprise at least one of a reflection prevention film preventing the light that is incident from the outside from being reflected to the outside, a near IR shield film shielding the near IR generated in the display device in order to prevent mis-operation of electronic devices such as remote controllers, a color correction film increasing the color purity by controlling a color tone by comprising a color control dye, and an electromagnetic wave shield film shielding the electromagnetic wave generated in a display device when a display apparatus is driven. Here, the electromagnetic wave shield film comprises a transparent substrate and a metal mesh pattern provided on the substrate.

Meanwhile, with regard to the display apparatus, as the spread of IPTVs is accelerated, a demand for a touch function that uses hands as a direct input apparatus without a separate input apparatus such as remote controllers is growing. In addition, a multi-touch function for recognizing a specific point and taking notes is required.

The touch panel performing the aforementioned function may be classified into the following types according to detection manner of a signal.

That is, examples thereof comprise a resistive type detecting a position pressed by pressure in a state where a direct voltage is applied while changing a current or voltage value, a capacitive type using capacitance coupling in a state where an alternating voltage is applied, an electromagnetic type detecting a selected position in a state where a magnetic field is applied as a change in voltage, and the like.

Among them, the resistive type and capacitive type touch panels that are most extensively spread recognize the touch by a change in electric contact or capacitance by using the transparent conductive film such as the ITO film. However, since the transparent conductive film has the high resistance of 100 ohms/square or more, the sensitivity is lowered when the display device is manufactured in a large scale, and as the size of screen is increased, the cost of the ITO film is rapidly increased, accordingly, it is not easy to perform commercialization thereof. In order to overcome this, there is an effort to implement enlargement by using a metal pattern having high conductivity.

Meanwhile, in the case of most known transparent conductive patterns, in general, a pitch is determined by calculating transmittance based on a line width of a line forming the conductive pattern, and the patterns have been adopted in large displays such as PDPs by introducing the pitch determined by this method into the patterns. However, determining of the pitch based on the line width of the line has problems in that it is inconvenient to use due to a problem where the line is seen by the eyes or interference of a pixel is hindered to distort displaying in the case of near field displays and electronic equipment used through a direct contact by a user.

DISCLOSURE

Technical Problem

Therefore, the present invention has been made in an effort to provide a conductive substrate comprising a conductive pattern having an improved concealment property which is not easily visible to the eyes of a user, and a method of manufacturing the same.

Technical Solution

An exemplary embodiment of the present invention provides a conductive substrate comprising: a transparent substrate, and a conductive pattern comprising a conductive line provided on the transparent substrate, wherein the conductive pattern comprises two or more conductive lines spaced from each other in a longitudinal direction of the conductive line, and a distance between nearest-adjacent ends of two or more conductive lines spaced from each other is 15 µm or less.

Another exemplary embodiment of the present invention provides a conductive substrate comprising: a transparent substrate, and a conductive pattern comprising a conductive line provided on the transparent substrate, wherein the conductive pattern comprises two or more conductive lines spaced from each other in a longitudinal direction of the conductive line, and the conductive pattern further comprises a conductive line provided in spaced regions to be electrically isolated, the conductive lines provided in the spaced regions to be electrically isolated have an area of 80% to 120% to a product of a length of the spaced region and a line width of the conductive line, and a distance between ends of the conductive lines provided in the spaced regions to be electrically isolated and ends of the conductive lines spaced from each other, which are adjacent thereto, is 15 µm or less.

Yet another exemplary embodiment of the present invention provides a method of manufacturing the conductive substrate, comprising: forming a conductive pattern provided on a transparent substrate so that the conductive pattern comprises a line breakage portion performing breakage at an angle of 80 to 110° in a longitudinal direction of at least one conductive line constituting the conductive pattern.

Still another exemplary embodiment of the present invention provides a touch panel comprising: the conductive substrate.

Advantageous Effects

The present invention relates to a conductive substrate comprising a conductive pattern having an improved concealment property and a touch panel comprising the same, and the conductive substrate according to the present invention is characterized in that a metal line comprised in the conductive pattern can be more efficiently concealed by forming a shortest distance between an end of a conductive line electrically disconnected to the conductive pattern and an end of the conductive pattern adjacent thereto to be 15 µm or less.

BEST MODE

Hereinafter, the present invention will be described in detail.

In the present invention, the degree of visibility of a pattern according to a line width and a pitch was judged by first manufacturing the patterns having various line widths and pitches and confirming the patterns at a distance of 20 cm in order to overcome the known problems. As a result, it was confirmed that the observer generally recognized the lines as a surface instead of the lines when the line width was 5 µm or less and the pitch was 300 µm or less, and the evaluation result is shown in the following FIG. 1.

Figure 1:
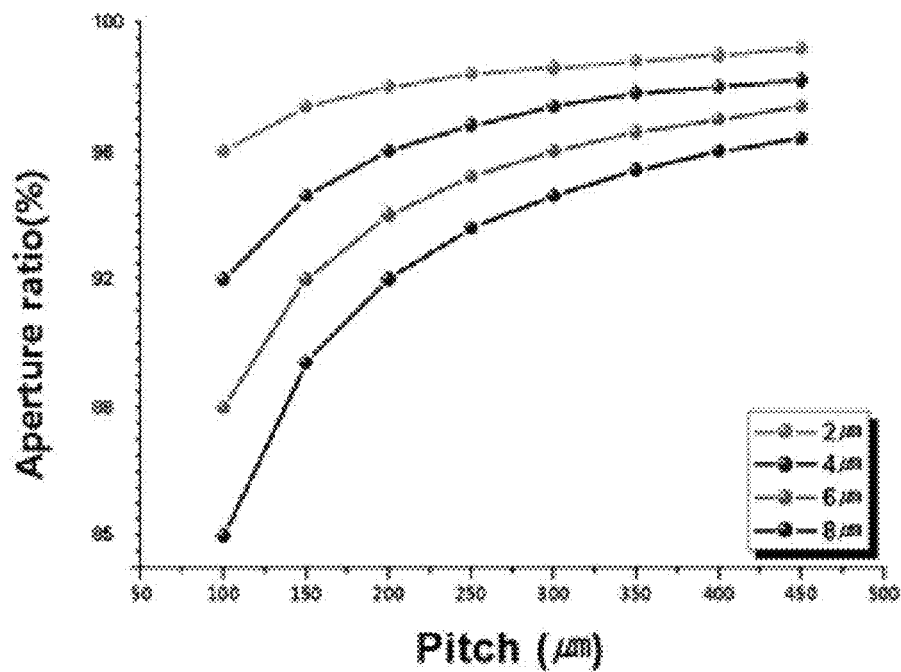
FIG. 1 is a view showing an aperture ratio according to a line width and a pitch of a conductive pattern, and a region where visibility of the pattern is not recognized based on the aperture ratio with regard to a change in line width and pitch of the conductive pattern.
Figure 1:
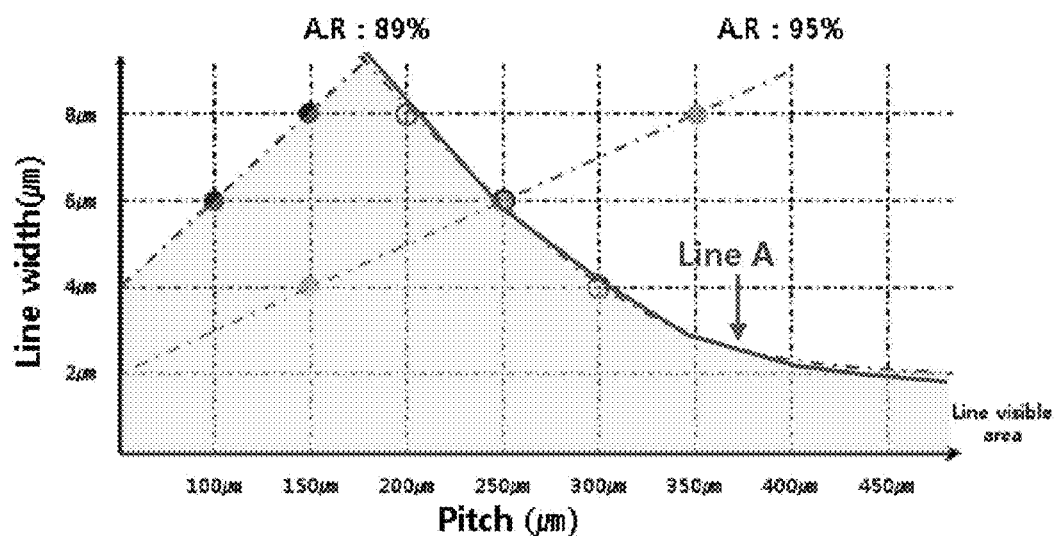

A left graph of FIG. 1 shows a graph of an aperture ratio according to the line width and the pitch by calculated numerical values, a right graph of FIG. 1 shows a region where visibility of the pattern based on the aperture ratio in a change in line width and pitch is not recognized, and in the case where the aperture ratio is 95%, a yellow green region corresponds to the region where visibility of the pattern is not recognized. In interpretation based on this result, in the case where the aperture ratio of 89% based on 4 µm is a target, the applicable pitch corresponds to the region of 50 to 300 µm, and in the case where the aperture ratio of 95% is a target, the region of 150 to 300 µm corresponds to the applicable region. Further, in the case where the aperture ratio of 95% is a target, the applicable maximum line width and pitch may be interpreted as a region to which the region having the line width of 6 µm and the pitch of 250 µm can be applied.

In the case where the line is broken on this pattern (particularly, mesh) to perform electric disconnection, a recognition property of the broken line largely depends on the line width property of the broken line and line width and pitch properties of the mesh on which the broken line is put.

In the present invention, in the case where products are manufactured through the mesh in practice, a generally applicable rule is constituted by disclosing a relationship of the line breakage method in breakage of the line, and the line width and reflectance of metal constituting the mesh on which the broken line is put.

Figure 2:
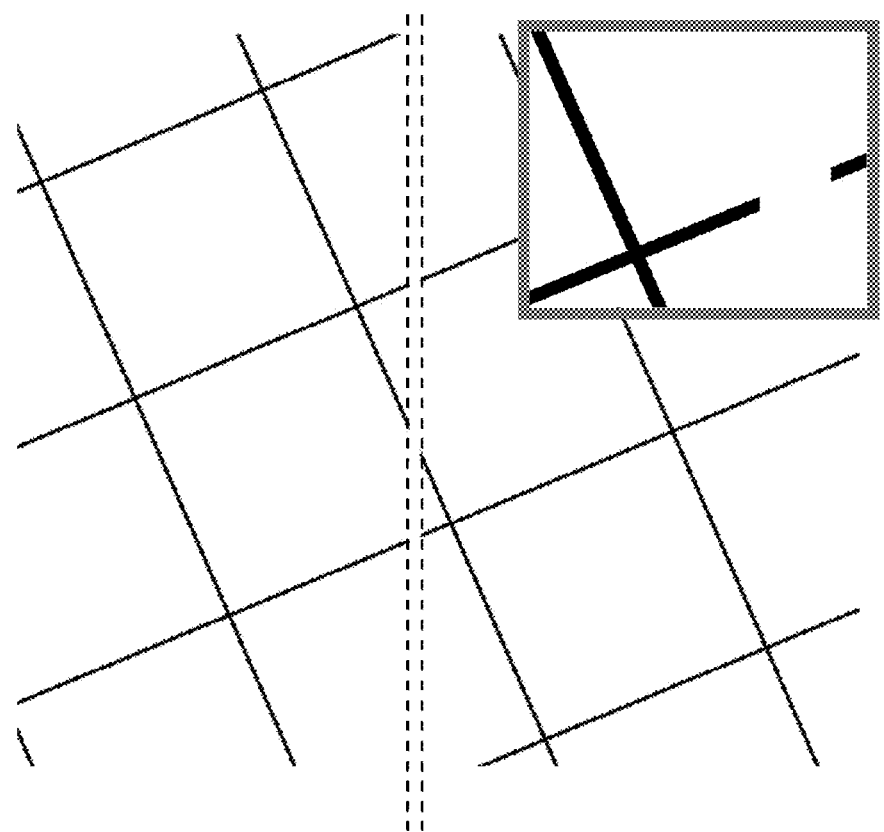
FIG. 2 is a view showing a line breakage method of a known conductive pattern.
Figure 3:
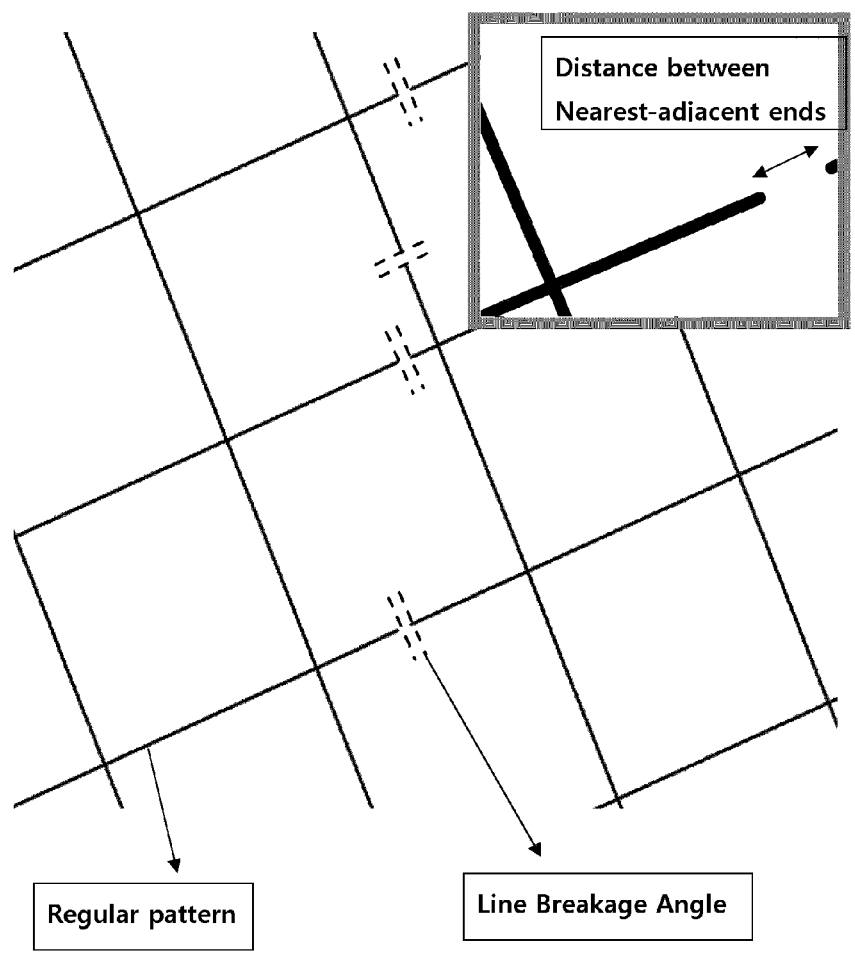
FIG. 3 is a view showing a line breakage method of the conductive pattern according to an exemplary embodiment of the present invention.
Figure 4:
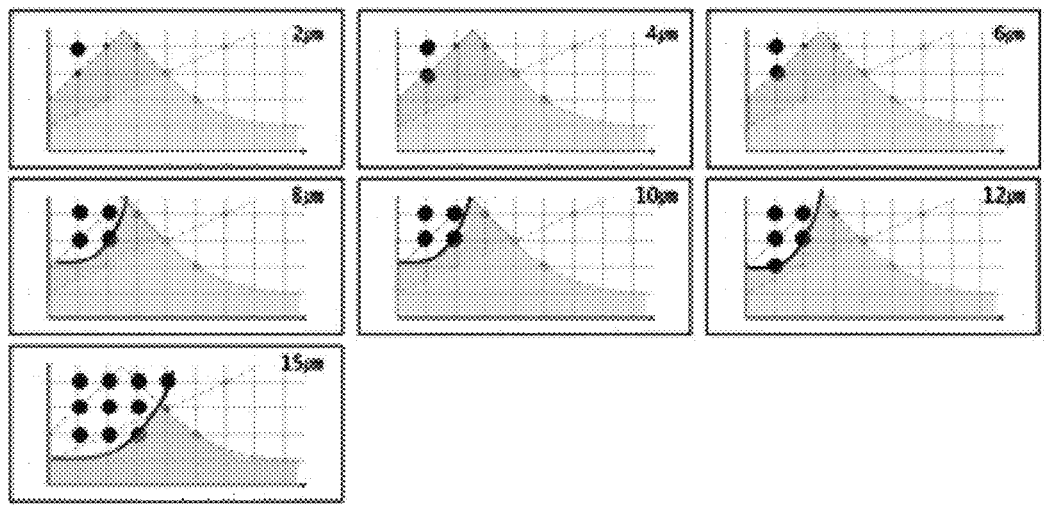
FIG. 4 is a view showing a result of confirmation of visibility according to the line width in line breakage of the conductive pattern comprising a metal mesh having reflectance of 50% according to a known method and the method of the present invention.
Figure 4:
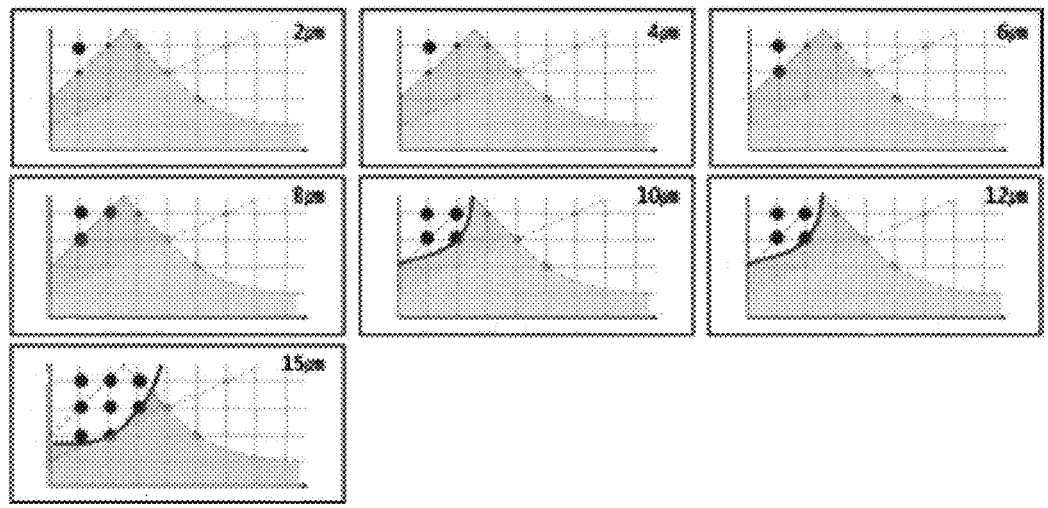
Figure 5:
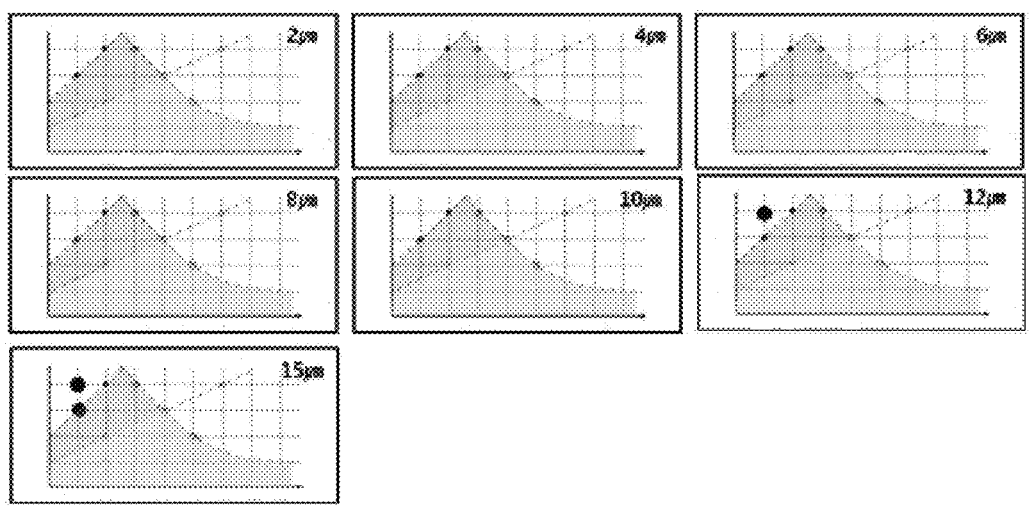
FIG. 5 is a view showing a result of confirmation of visibility according to the line width in line breakage of the conductive pattern comprising the metal mesh having reflectance of 20% according to the known method and the method of the present invention.
Figure 5:
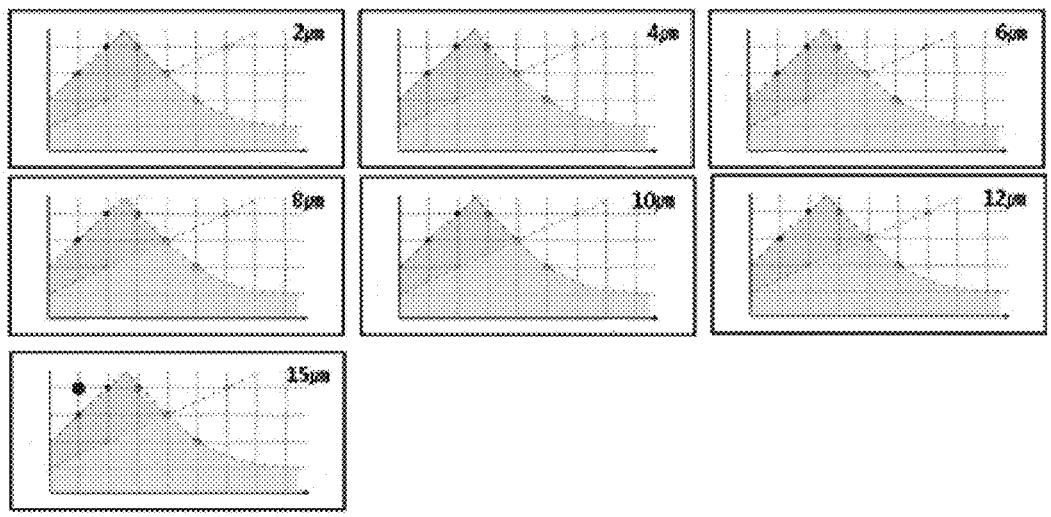

FIG. 2 shows a known general line breakage method of a conductive pattern, and FIG. 3 shows a line breakage method of a conductive pattern according to the exemplary embodiment of the present invention. That is, in the present invention, the aforementioned contents were confirmed by comparatively evaluating the line breakage methods of the conductive pattern of FIGS. 2 and 3 and, at the same time, performing evaluation while changing reflectance of the metal line constituting the mesh.

In order to confirm the relationship of the line breakage method of the conductive pattern, and the line width and the pitch of the mesh as described above, the region where the metal line in the conductive pattern was recognized was observed while changing the line width of the broken line from 2 µm to 15 µm on the meshes having different line widths and pitches in the metal lines having reflectance of 50% and 20% by using the known general line breakage method of the conductive pattern (A type) and the line breakage method (B type) of the conductive pattern according to the exemplary embodiment of the present invention (FIGS. 4 to 7). More specifically, in the observation method of recognition of the metal line, evaluation was performed by total 100 persons at a distance of 20 cm and the average value was then obtained.

As a result, it can be confirmed that the concealment property is better in the case of B type with regard to the same line width of the broken line, and in the case where the applicable region is judged when the pattern is designed based on this, it can be confirmed that the wider applicable region is ensured in the case of type B (it is preferable that blue and red color regions less invade the aforementioned usable region).

The present evaluation was identically performed by using the metal surface having reflectance of 20%, and as a result, likewise, it was confirmed that in the case of type B, the higher concealment property was ensured, but as compared to the case where the aforementioned metal having reflectance of 50% is used, it was confirmed that the scope of the line width of the broken line recognized by a person was more largely reduced.

Figure 6:
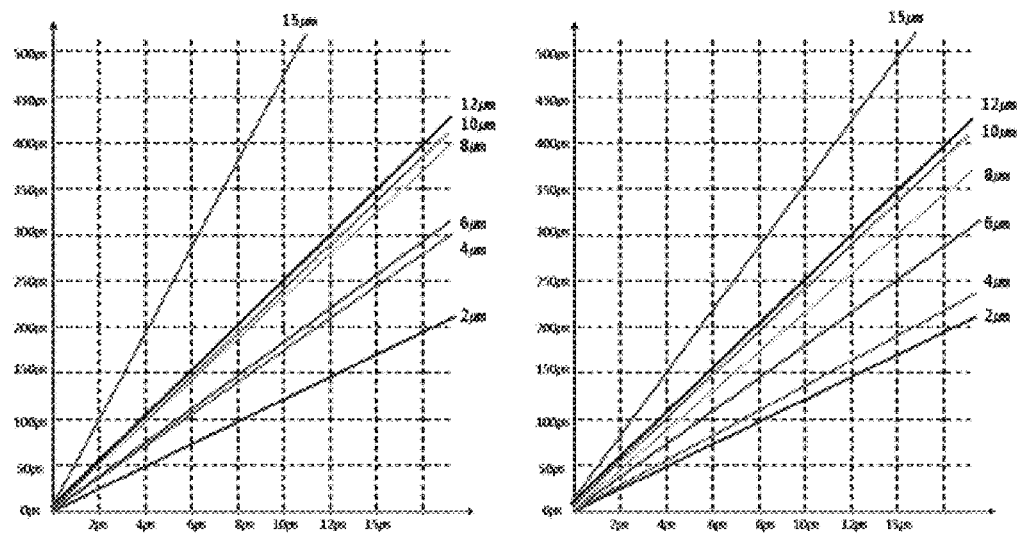
FIG. 6 is a view showing a region of recognition of a broken line according to the line width in line breakage of the conductive pattern comprising the metal mesh having reflectance of 50% according to the known method and the method of the present invention.
Figure 7:
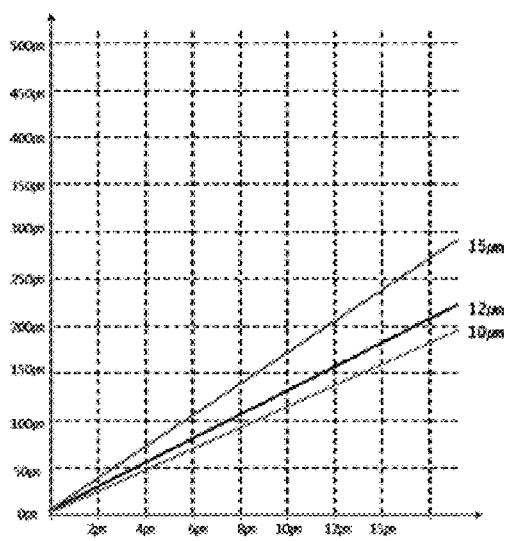
FIG. 7 is a view showing a region of recognition of a broken line according to the line width in line breakage of the conductive pattern comprising the metal mesh having reflectance of 20% according to the known method and the method of the present invention.
Figure 7:
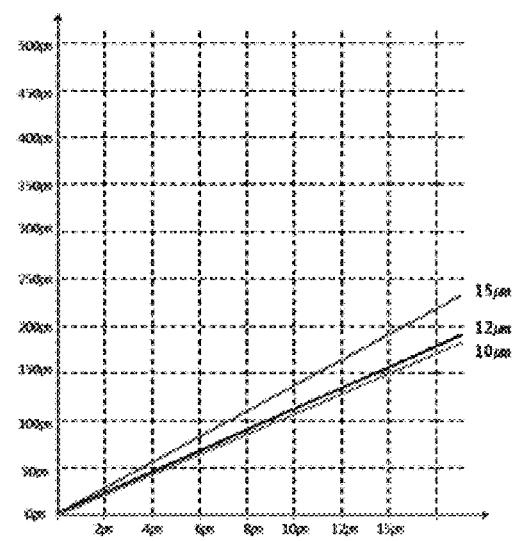

Based on this result, the results obtained by observing the region where the broken line was recognized while changing the line width of the broken line from 2 µm to 15 µm on the meshes having different line widths and pitches by applying the line breakage methods of A and B types are shown in FIGS. 6 and 7. Through this, it could be confirmed that the concealment property of the metal line was relatively better in the case where the metal line having low reflectance was used.

Figure 8:
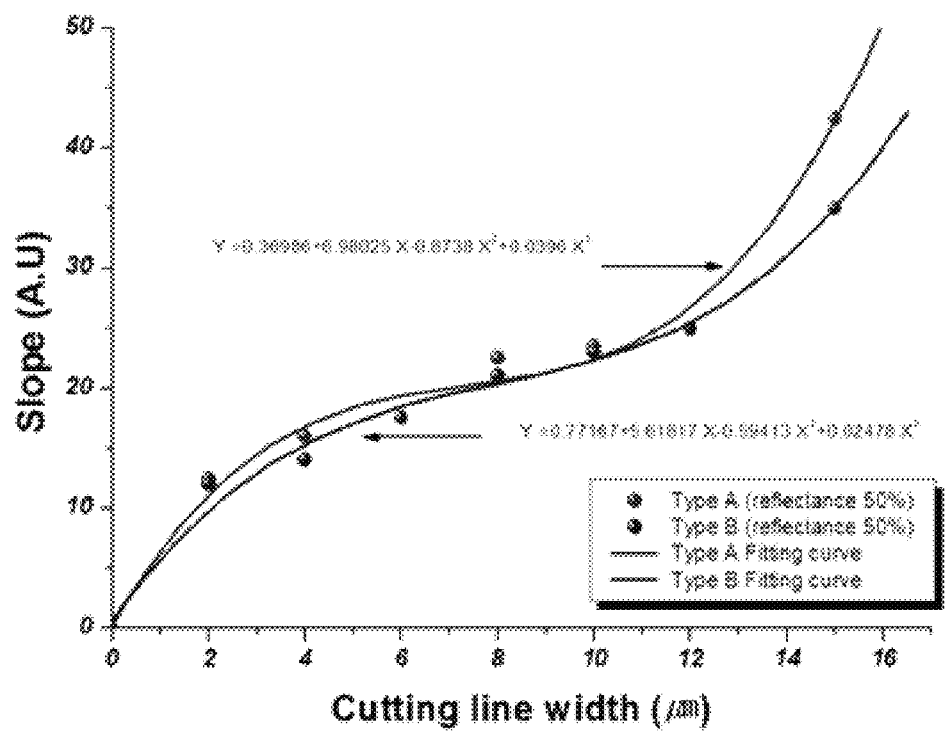
FIG. 8 is a view showing a change in slope to the line width in line breakage of the conductive pattern comprising the metal mesh having reflectance of 50% according to the known method and the method of the present invention.
Figure 9:
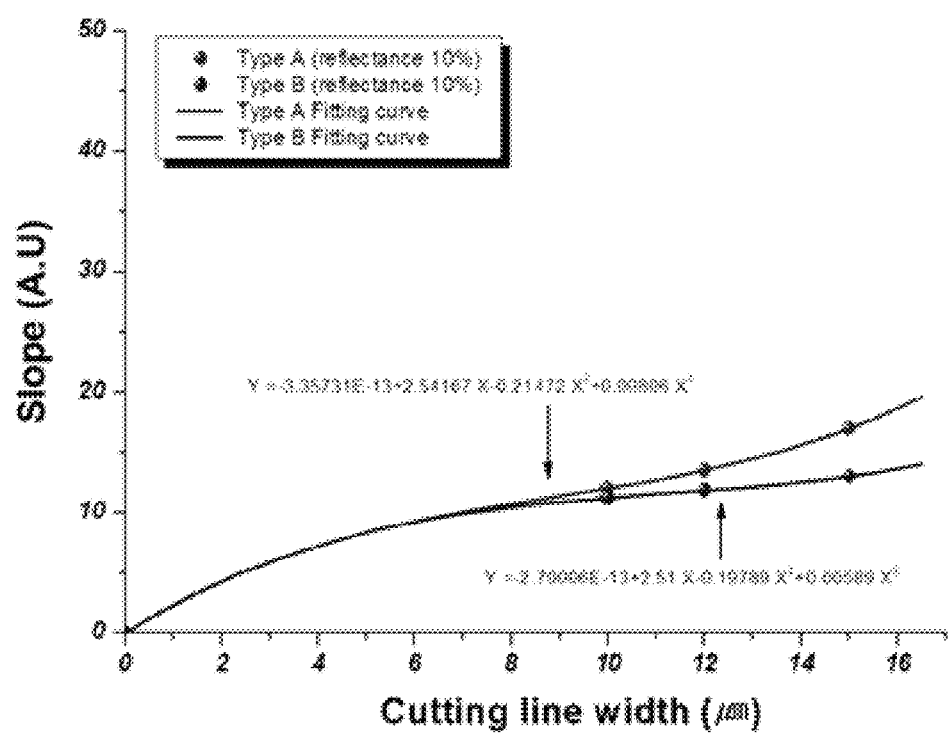
FIG. 9 is a view showing a change in slope to the line width in line breakage of the conductive pattern comprising the metal mesh having reflectance of 10% according to the known method and the method of the present invention.

In order to confirm the tendency of the visibility to the line width of the broken line and the line width of the mesh with the exception of the relationship with the pitch in the aforementioned result (in the case of the pitch, in consideration of recognition property, if the line of 2 μm is basically excluded, the usable region of 300 μm or less is suggested), the change in slope to the width of the broken line was observed in each case, and the results are shown in FIGS. 8 and 9.

In FIGS. 8 and 9, it can be confirmed that the width of the change in slope shows the tendency of a cubic function, and in this case, in a section where the recognition by the persons is largely changed in each case, the slope is largely changed through differentiation of the obtained cubic function. In this case, the graph of the differential function is the same as that of FIG. 10.

Figure 10:
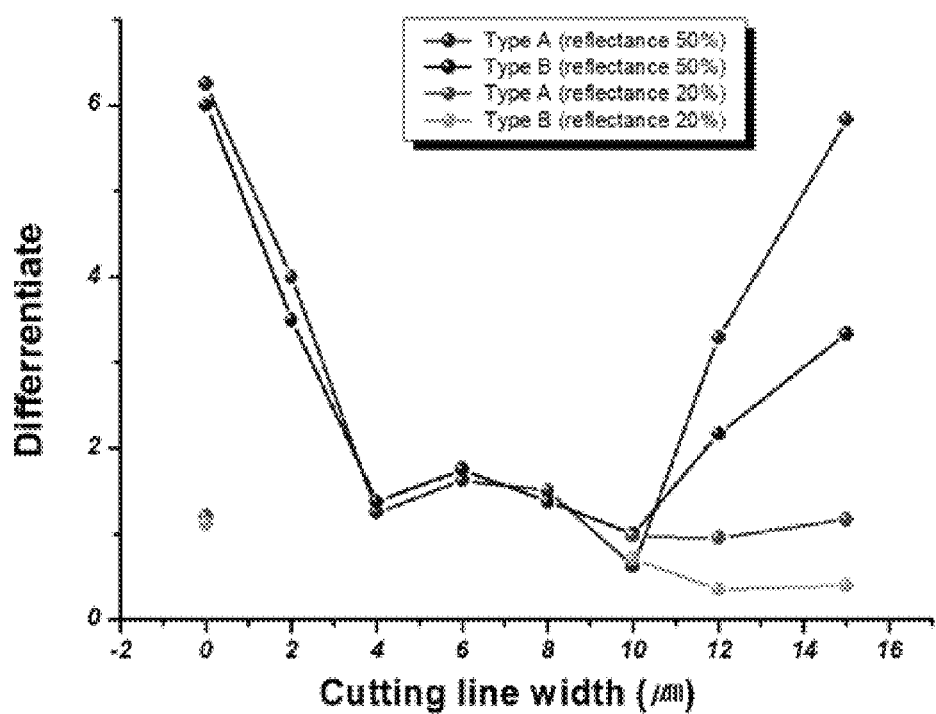
FIG. 10 is a view showing a differential function to graphs of FIGS. 8 and 9.
Figure 11:
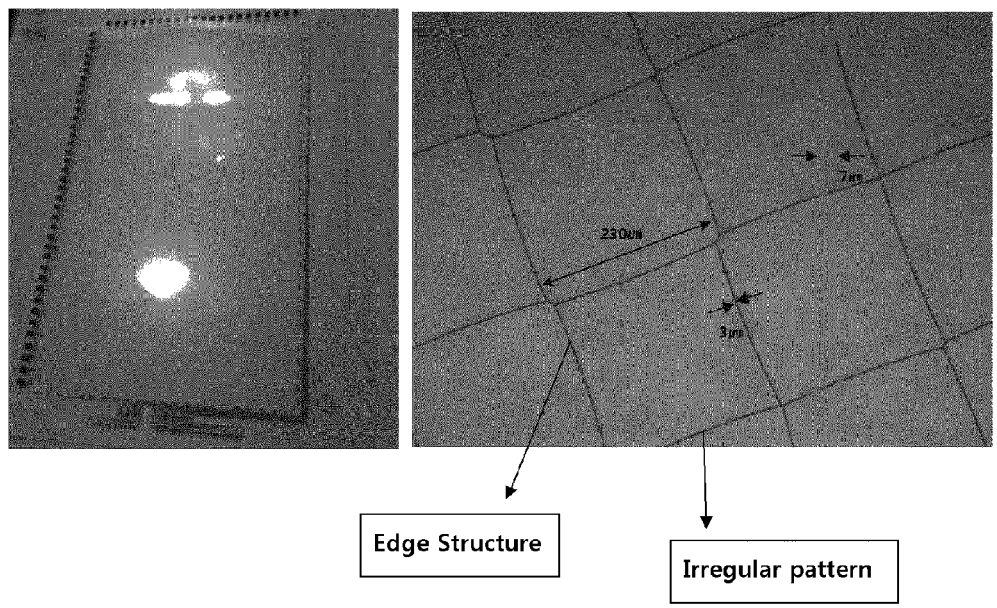
FIG. 11 is a view showing a transparent conductive film according to the exemplary embodiment of the present invention.
Figure 12:
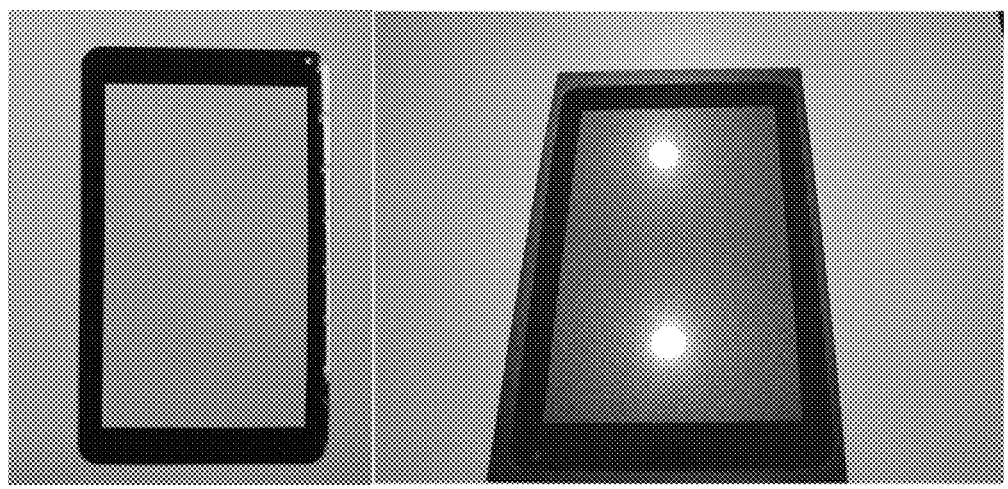
FIG. 12 is a view showing a touch screen manufactured by using the transparent conductive film according to the exemplary embodiment of the present invention.

As confirmed from the result of FIG. 10, it can be confirmed that the region where the line width of the broken line is most significantly affected according to the shape of the broken line and the reflectance of metal is determined based on the line widths of 4 μm and 10 μm, and a large deviation is not shown in a middle region. If this is analyzed, it is confirmed that in the case of the user, when the region of the broken line is widened from 2 μm to 4 μm, first visibility is recognized, the same level of visibility is then maintained, the region is rapidly affected by the line width of the broken line and reflectance at a starting point of 10 μm. That is, combining these, it can be confirmed that the line width of the broken line not largely affected by reflectance of metal and other factors may be defined as 10 μm, and in the case of the broken line having the width that is larger than the aforementioned value, the recognition property is largely changed according to the type of the broken line and reflectance of metal. Based on this, it can be confirmed that the possible line width of the broken line based on the differential value 1 is preferably about 15 μm or less in the case of the metal having reflectance of 20% and the A type. Combining these, it is preferable to use a material having metal reflectance of 20% or less, in which the possible line width of the broken line is about 15 μm or less.

The exemplary embodiment of the conductive substrate according to the present invention comprises a transparent substrate, and the conductive pattern comprising the conductive line provided on the transparent substrate, wherein the conductive pattern comprises two or more conductive lines spaced from each other in a longitudinal direction of the conductive line, and a distance between nearest-adjacent ends of two or more conductive lines spaced from each other is 15 μm or less.

The distance between the nearest-adjacent ends of two or more conductive lines spaced from each other may be 15 μm or less, more than 0 μm and 10 μm or less, and 1 μm or more and 5 μm or less.

In the present specification, the distance between the nearest-adjacent ends of two or more conductive lines spaced from each other means the distance between the adjacent ends, which are closest to each other, of two or more conductive lines spaced from each other, and a specific example thereof is shown in the following FIG. 3.

The conductive substrate according to the present invention may comprise a line breakage portion performing breakage at an angle of 80 to 110° in the longitudinal direction of at least one conductive line constituting the conductive pattern. The line breakage portion may be provided on only a portion of the conductive pattern.

In the conductive substrate according to the present invention, the conductive pattern may comprise the pattern formed of a conductive metal line. Herein, the pattern formed of the conductive metal line may comprise a closed curve formed of a straight line, a curved line, or the straight line and the curved line.

In the conductive substrate according to the present invention, the conductive pattern may comprise a regular pattern or an irregular pattern.

The conductive pattern may be the regular pattern or the irregular pattern.

A pattern shape of the art, such as a mesh pattern, may be used as the regular pattern. The mesh pattern may comprise a regular polygonal pattern comprising one or more shapes of a triangle, a quadrangle, a pentagon, a hexagon, and an octagon.

In the exemplary embodiment of the present invention, the electric conductive pattern is a regular pattern and comprises cross points formed by crossing a plurality of predetermined lines among lines constituting the conductive pattern, and in this case, the number of cross points may be 3,000 to 122,500, 13,611 to 30,625, and 19,600 to 30,625 in an area of 3.5 cm×3.5 cm. Further, according to the exemplary embodiment of the present invention, when the pattern is provided in a display, it is confirmed that an optical property of the display is not largely spoiled in the case where the number of cross points is 4,000 to 123,000.

Further, in the exemplary embodiment of the present invention, the conductive pattern is the irregular pattern and comprises cross points formed by crossing a plurality of predetermined lines among the lines constituting the conductive pattern, and in this case, the number of cross points may be 6,000 to 245,000, 3,000 to 122,500, 13,611 to 30,625, and 19,600 to 30,625 in an area of 3.5 cm×3.5 cm. Further, according to the exemplary embodiment of the present invention, when the pattern is provided in the display, it is confirmed that the optical property of the display is not largely spoiled in the case where the number of cross points is 4,000 to 123,000.

The pitch of the conductive pattern may be 600 μm or less and 250 μm or less, but the pitch may be adjusted according to transmittance and conductivity required by the person with ordinary skill in the art.

The conductive pattern used in the present invention is appropriately a material having specific resistance of $1 \times 10^6$ to $30 \times 10^6$ ohm·cm, and more preferably $7 \times 10^6$ ohm·cm or less.

In the present invention, the conductive pattern may be the irregular pattern.

The irregular pattern comprises an edge structure of continuously connected closed figures, the closed figures having the same shape are not present in a predetermined irregular unit area (1 cm×1 cm), and the number of vertexes of the closed figures may be different from the number of vertexes of the quadrangles having the same number as the closed figures. More specifically, the number of vertexes of the closed figures may be larger than or 1.9 to 2.1 times larger than the number of vertexes of the quadrangles having the same number as the closed figures, but is not limited thereto.

The closed figures are continuously connected to each other, and for example, in the case where the closed figures are polygons, the adjacent closed figures may have a shape sharing at least one side.

The irregular pattern comprises the edge structure of continuously connected closed figures, the closed figures having the same shape are not present in a predetermined unit area (1 cm×1 cm) in the irregular pattern, and the number of vertexes of the closed figures may be different from the number of vertexes of the polygon formed by connecting shortest distances between centers of gravity of the closed figures. More specifically, the number of vertexes of the closed figures may be larger than or 1.9 to 2.1 times larger than the number of vertexes of the polygons formed by connecting the shortest distances between centers of gravity of the closed figures, but is not limited thereto.

The irregular pattern comprises the edge structure of the continuously connected closed figures, the closed figures having the same shape are not present in a predetermined unit area (1 cm×1 cm) in the irregular pattern, and a value of the following Equation 1 may be 50 or more in the closed figures.

(Standard deviation of distances between the vertexes/
Average of the distances between the vertexes)×
100  [Equation 1]

The value of Equation 1 may be calculated in the unit area of the conductive pattern. The unit area may be an area where the conductive pattern is formed, and, for example, 3.5 cm×3.5 cm and the like, but is not limited thereto.

In the present invention, the vertex means a point at which the lines constituting the edge of the closed figures of the conductive pattern cross each other.

The irregular pattern may have a shape of the edge structure of the closed figures obtained by after disposing predetermined points in regularly arranged unit cells, connecting the points to the closest points thereto as compared to the distances from other points.

In this case, in the case where randomness is introduced into a manner where predetermined points are disposed in the regularly arranged unit cells, the irregular pattern may be formed. For example, in the case where randomness is provided as 0, if the unit cell is a square, the conductive pattern has a square mesh structure, and if the unit cell is a regular hexagon, the conductive pattern has a honeycomb structure. That is, the irregular pattern means a pattern where randomness is not 0.

A leaning phenomenon and the like of lines constituting the pattern may be suppressed, uniform transmittance may be obtained from the display, the linear density to the unit area may be maintained as the same value, and uniform conductivity may be ensured by the conductive pattern having the irregular pattern shape according to the present invention.

In the present invention, the material of the conductive pattern is not particularly limited, but is preferably metal. It is preferable that the material of the conductive pattern have excellent conductivity and be easily etched.

In the present invention, even though the material having the total reflectance of 70 to 80% or more is used, it is possible to decrease the total reflectance, decrease visibility of the electric conductive pattern, and maintain or improve a contrast property.

Specific examples of the material of the conductive pattern preferably comprise a single film or a multilayered film comprising gold, silver, aluminum, copper, neodymium, molybdenum, nickel, or an alloy thereof. Herein, the thickness of a first conductive pattern and a second conductive pattern is not particularly limited, but is preferably 0.01 to 10 μm in terms of the conductivity of the conductive pattern and the economic efficiency of the forming process thereof.

The forming of the conductive pattern may adopt a method using an etching resist pattern. The etching resist pattern may be formed by using a printing method, a photolithography method, a photography method, a method using a mask, or laser transferring, for example, thermal transfer imaging, and the printing method or photolithography method is more preferable. The electric conductive pattern may be etched by using the etching resist pattern, and the etching resist pattern may be removed.

In the present invention, the line width of the conductive pattern may be 10 μm or less, 7 μm or less, 5 μm or less, 4 μm or less, 2 μm or less, or 0.1 μm or more. To be more specific, the line width of the conductive pattern may be 0.1 to 1 μm, 1 to 2 μm, 2 to 4 μm, 4 to 5 μm, 5 to 7 μm, or the like, but is not limited thereto.

Further, the line width of the conductive pattern may be 10 μm or less and the thickness thereof may be 10 μm or less, the line width of the conductive pattern may be 7 μm or less and the thickness thereof may be 1 μm or less, or the line width of the conductive pattern may be 5 μm or less and the thickness thereof may be 0.5 μm or less.

To be more specific, in the present invention, the line width of the conductive pattern may be 10 μm or less, and in the conductive pattern, the number of vertexes of the closed figures in the area of 3.5 cm×3.5 cm may be 6,000 to 245,000. Further, the line width of the conductive pattern may be 7 μm or less, and in the conductive pattern, the number of vertexes of the closed figures in the area of 3.5 cm×3.5 cm may be 7,000 to 62,000. Further, the line width of the conductive pattern may be 5 μm or less, and in the conductive pattern, the number of vertexes of the closed figures in the area of 3.5 cm×3.5 cm may be 15,000 to 62,000.

The aperture ratio of the conductive pattern, that is, the ratio of the area not covered by the pattern, may be 70% or more, 85% or more, and 95% or more. In addition, the aperture ratio of the conductive pattern may be 90 to 99.9%, but is not limited thereto.

The conductive pattern used in the present invention is appropriately a material having specific resistance of $1 \times 10^6$ to $30 \times 10^6$ ohm·cm, and more preferably $7 \times 10^6$ ohm·cm or less.

In the present invention, in the case where the conductive pattern described above is formed on the transparent substrate by using the method to be described below, the line width and the line height may be made uniform. According to the exemplary embodiment of the present invention, at least a portion of the conductive pattern may be arbitrarily different from the remaining pattern. The desired conductive pattern may be obtained by the aforementioned configuration. For example, when it is required that the electric conductivity of a portion of the area is higher than that of the remaining area according to the purpose, or in the case of the touch panel electrode, the touch recognition of a portion of the area is more sensitively required, the conductive patterns of the corresponding region and the remaining region may be set to be different from each other through a change in pitch value during an initial design and the like. The line widths and the line intervals of the printing pattern may be set to be different from each other so that at least a portion of the conductive pattern is set to be different from the remaining printing pattern. As an example thereof, in the case of the capacitance touch screen, it is considered as a big issue whether a portion connected to the pad at the side thereof has high conductivity or not.

According to the exemplary embodiment of the present invention, the conductive substrate may comprise a region in which the conductive pattern is not formed.

Further, the exemplary embodiment of the conductive substrate according to the present invention a transparent substrate, and a conductive pattern comprising a conductive line provided on the transparent substrate, wherein the conductive pattern further comprises two or more conductive lines spaced from each other in a longitudinal direction of the conductive line and provided in spaced regions to be electrically isolated, the conductive lines provided in the spaced regions to be electrically isolated have an area of 80% to 120% to a product of a length of the spaced region and a line width of the conductive line, and a distance between ends of the conductive lines provided in the spaced regions to be electrically isolated and ends of the conductive lines spaced from each other, which are adjacent thereto, is 15 μm or less.

The distance between the ends of the conductive lines provided in the spaced regions to be electrically isolated and the ends of the conductive lines spaced from each other, which are adjacent thereto, may be 15 μm or less, more than 0 μm and 10 μm or less, and 1 μm or more and 5 μm or less.

In the transparent conductive substrate according to the present invention, the conductive line may have the area of 80 to 120% to the area of the region corresponding to the line breakage portion, and may have the length of 80 to 120% to the length of the region corresponding to the line breakage portion.

In the conductive substrate according to the present invention, the pattern of the broken line formed when the line breakage portions are connected may comprise an irregular pattern shape. Since the content of the shape of the irregular pattern of the broken line is the same as the shape of the aforementioned irregular conductive pattern, a specific description thereof will be omitted.

In the conductive substrate according to the present invention, the pattern of the broken line formed when the line breakage portions are connected may further comprise a regular pattern shape. In this case, it is preferable that the shape of the regular pattern be less than 20% of the shape of the entire pattern of the broken line.

In the present invention, it is preferable to use the metal having excellent electric conductivity as the material of the conductive pattern. In addition, the specific resistance value of the conductive pattern material is preferably 1 microOhm cm or more and 200 microOhm cm or less. Specific examples of the conductive pattern material may comprise copper, silver, gold, iron, nickel, aluminum, carbon nanotube (CNT), or the like, and silver is the most preferable. The electric conductive pattern material may be used in a particle form. In the present invention, copper particles coated with silver may be used as the conductive pattern material.

In the present invention, in the case where the paste comprising the electric conductive pattern material is used, the paste may further comprise an organic binder in addition to the electric conductive pattern material described above so as to easily perform the printing process. It is preferable that the organic binder have a volatile property in a firing process. Examples of the organic binder comprise a polyacryl-based resin, a polyurethane-based resin, a polyester-based resin, a polyolefine-based resin, a polycarbonate-based resin, a cellulose resin, a polyimide-based resin, a polyethylene naphthalate-based resin, a denatured epoxy resin, and the like, but are not limited thereto.

The paste may further comprise a glass frit in order to improve an attachment ability of the paste to the transparent substrate such as glass. The glass frit may be selected from the commercial products, but it is preferable to use the environmentally friendly glass frit without lead component. In this case, it is preferable that the average diameter of the used glass frit be 2 μm or less and the maximum diameter thereof be 50 μm or less.

If necessary, a solvent may be further added to the paste. Examples of the solvent comprise butyl carbitol acetate, carbitol acetate, cyclohexanon, cellosolve acetate, terpineol, and the like, but are not limited thereto.

In the present invention, in the case where the paste comprising the conductive pattern material, the organic binder, the glass frit, and the solvent is used, it is preferable that the weight ratio of the electric conductive pattern material be 50 to 90%, the weight ratio of the organic binder be 1 to 20%, the weight ratio of the glass frit be 0.1 to 10%, and the weight ratio of the solvent be 1 to 20%.

According to the exemplary embodiment of the present invention, the conductive pattern may be blackened. If the paste comprising the metal material is sintered at high temperatures, metal gloss is shown, such that the visibility may be lowered because of the reflection of light and the like. The aforementioned problem may be prevented by blackening the conductive pattern. In order to blacken the conductive pattern, the blackening material may be added to the paste for forming the electric conductive pattern or blackening treatment may be performed after the paste is printed and sintered, thereby blackening the conductive pattern.

Examples of the blackening material that may be added to the paste comprise metal oxide, carbon black, carbon nanotube, black pigments, colored glass frit and the like. In this case, the composition of the paste may comprise 50 to 90 wt % of the electric conductive pattern material, 1 to 20 wt % of the organic binder, 1 to 10 wt % of the blackening material, 0.1 to 10 wt % of the glass frit, and 1 to 20 wt % of the solvent.

When the blackening treatment is performed after the sintering, the composition of the paste may comprise 50 to 90 wt % of the electric conductive pattern material, 1 to 20 wt % of the organic binder, 0.1 to 10 wt % of the glass frit, and 1 to 20 wt % of the solvent. The blackening treatment after the sintering comprises dipping into the oxidized solution, for example, the solution comprising the Fe or Cu ion, dipping into the solution comprising a halogen ion such as a chlorine ion, dipping into hydrogen peroxides and nitric acids, treatment using the halogen gas, and the like.

According to the exemplary embodiment of the present invention, manufacturing may be performed by dispersing the electric conductive pattern material, the organic binder, and the glass frit in the solvent. Specifically, the organic binder resin solution is manufactured by dissolving the organic binder in the solvent, the glass frit is added thereto, the aforementioned metal powder as the conductive material is finally added thereto, the solution is kneaded, and the metal powder and the glass frit that are agglomerated are uniformly dispersed by using the three stage roll mill. However, the present invention is not limited to the aforementioned method.

Further, the exemplary embodiment of the method of manufacturing the conductive substrate according to the present invention comprises forming a conductive pattern provided on a transparent substrate so that the conductive pattern comprises a line breakage portion performing breakage at an angle of 80 to 110° in a longitudinal direction of at least one conductive line constituting the conductive pattern.

In the present invention, after the desired pattern form is first determined, the precise conductive pattern having the small line width may be formed on the transparent substrate by using a printing method, a photolithography method, a photography method, a method using a mask, a sputtering method, an inkjet method, or the like. When the pattern form is determined, a Voronoi diagram generator may be used, such that a complex pattern form may be easily determined. Herein, the Voronoi diagram generator means dots disposed so that the Voronoi diagram can be formed as described above. However, the scope of the present invention is not limited thereto, and another method may be used when the desired pattern form is determined.

The printing method may be performed by using a method in which the paste comprising the electric conductive pattern material is transferred on the transparent substrate in the desired pattern form and then sintered.

The transferring method is not particularly limited, but the aforementioned pattern form may be formed on a pattern transferring medium such as an intaglio or a screen and the desired pattern may be transferred on the transparent substrate by using the pattern form. The method of forming the pattern form on the pattern transferring medium may be performed by using a method known in the art.

The printing method is not particularly limited, and a printing method such as offset printing, screen printing, gravure printing, flexo printing, and inkjet printing may be used, and one or more complex methods among the methods may be used. The printing method may adopt a roll to roll method, roll to plate, plate to roll, or plate to plate method.

The offset printing may be performed by using the method in which after the paste is filled in the intaglio on which the pattern is formed, first transferring is performed by using silicon rubber called the blanket, and the second transferring is performed by bringing the blanket into close contact with the transparent substrate. The screen printing may be performed by using the method in which after the paste is disposed on the screen on which the pattern is formed, the paste is directly provided on the substrate through the screen having the space while pushing the squeeze. The gravure printing may be performed by using the method in which after the paste is filled in the pattern while winding the blanket where the pattern is formed on the roll, the paste is transferred on the transparent substrate. In the present invention, the aforementioned methods may be used, and the aforementioned methods may be used in combination. In addition, other printing methods known to the person with ordinary skill in the art may be used.

In the case of the offset printing method, since most of the paste is transferred on the transparent substrate such as glass because of the release property of the blanket, a separate blanket washing process is not required. The intaglio may be manufactured by precisely etching the glass on which the desired electric conductive pattern is formed, and metal or DLC (diamond-like carbon) coating may be performed on the glass surface for durability. The intaglio may be manufactured by etching the metal plate. Particularly, in the present invention, it is preferable to use a reverse offset printing process, but it is not limited thereto.

In the present invention, it is preferable to use the offset printing method in order to implement the more precise conductive pattern. After the paste is filled in the pattern of the intaglio by using the doctor blade as the first step, the first transferring is performed by rotating the blanket, and the second transferring is performed on the surface of the transparent substrate by rotating the blanket as the second step.

In the present invention, it is not limited to the aforementioned printing method, and the photolithography process may be used. For example, the photolithography process may be performed by using the method in which the conductive pattern material layer is formed on the entire surface of the transparent substrate, the photoresist layer is formed thereon, the photoresist layer is patterned by the selective exposure and developing processes, the conductive pattern is patterned by using the patterned photoresist layer as the mask, and the photoresist layer is removed.

The present invention may adopt the photolithography method. For example, after the picture photosensitive material comprising silver halide is applied on the transparent substrate, the pattern may be formed by selective exposing and developing processes of the photosensitive material. A detailed example will be described below. First, the photosensitive material for negative is applied on the substrate on which the pattern will be formed. In this case, a polymer film such as PET and acetyl celluloide may be used as the substrate. The polymer film material on which the photosensitive material is applied is called the film herein. The photosensitive material for negative may be formed of silver halide in which AgBr that is very sensitive to light and regularly reacted therewith and a small amount of AgI were mixed with each other. Since the image developed by picturing the general photosensitive material for negative is a negative picture that is opposite to the subject in terms of light and shade, the picturing may be performed by using the mask having the pattern form that will be formed and preferably irregular pattern form.

Plating treatment may be further performed in order to increase the conductivity of the conductive pattern formed by using the photolithography and photography processes. The plating may adopt an electroless plating method, copper or nickel may be used as the plating material, and after the copper plating is performed, nickel plating may be performed thereon, but the scope of the present invention is not limited thereto.

The present invention may adopt the method using the mask. For example, the patterning may be performed by depositing the conductive pattern material on the substrate after the mask having the desired conductive pattern form is disposed to be close to the substrate.

In this case, the depositing method may adopt a heat deposition method by heat or electron beam, a PVD (physical vapor deposition) method such as sputter, and a CVD (chemical vapor deposition) method using an organometal material.

In the present invention, in the case where the aforementioned paste is used, if the paste is sintered after being printed by the aforementioned pattern, the pattern having the electric conductivity is formed. In this case, the sintering temperature is not particularly limited, but may be 400 to 800° C. and preferably 600 to 700° C. In the case where the transparent substrate forming the electric conductive pattern is glass, if necessary, the glass may be shaped for the purpose in the sintering step. In addition, in the case where the plastic substrate or film is used as the transparent substrate forming the electric conductive pattern, it is preferable that the sintering be performed at relatively low temperatures. For example, the sintering may be performed at 50 to 350° C.

Further, the present invention provides a touch panel comprising the conductive substrate. The touch panel according to the present invention may comprise a lower substrate; an upper substrate; and an electrode layer provided on any one surface or both surfaces of a surface of the lower substrate, which is in contact with the upper substrate, and a surface of the upper substrate, which is in contact with the lower substrate. The electrode layer may have X axis and Y axis position detection functions.

In this case, one or both of the electrode layer provided on the lower substrate and the surface of the lower substrate, which is in contact with the upper substrate; and the electrode layer provided on the upper substrate and the surface of the upper substrate, which is in contact with the lower substrate may be the aforementioned conductive substrate according to the present invention. In the case where only any one of the electrode layers is the conductive substrate according to the present invention, the other one may have the pattern known in the art.

In the case where the electrode layer is provided on one surface of each of both the upper substrate and the lower substrate to form a double-layered electrode layer, an insulating layer or a spacer may be provided between the lower substrate and the upper substrate so as to constantly maintain an interval between the electrode layers and prevent connection therebetween. It is preferable that the insulating layer be an adhesive or a UV or heat curable resin. The touch panel may further comprise a ground portion connected to the aforementioned electric conductive pattern. For example, the ground portion may be formed at an edge portion of the surface on which the electric conductive pattern of the substrate is formed. Further, at least one of an antireflection film, a polarizing film, and a fingerprint resistant film may be provided on at least one surface of the laminate comprising the conductive substrate. Other kinds of functional films may be further comprised in addition to the aforementioned functional films according to the design specification. The touch panel may be applied to display apparatuses such as an OLED display panel (PDP), a liquid crystal display (LCD), a cathode-ray tube (CRT), and a PDP.

A haze value of the touch panel may be 10% or less, and transmittance may be 75% or more. To be more specific, the touch panel may have the haze value of 10% or less and transmittance of 75% or more, the haze value of 5% or less and transmittance of 85% or more, and the haze value of 2% or less and transmittance of 90% or more.

The touch panel comprising the conductive substrate according to the present invention comprises two or more conductive lines spaced from each other in a longitudinal direction of the conductive line, and a conductive pattern where a distance between nearest-adjacent ends of two or more conductive lines spaced from each other is 15 μm or less, thus more efficiently concealing a metal line comprised in the conductive pattern.

The invention claimed is:

1. A conductive substrate comprising:
   a transparent substrate, and
   a conductive pattern comprising a conductive line provided on the transparent substrate,
   wherein the conductive pattern comprises two or more conductive lines spaced from each other in a longitudinal direction of the conductive line, and a distance between nearest-adjacent ends of two or more conductive lines spaced from each other is 15 μm or less,
   wherein the conductive pattern comprises one or more selected from the group consisting of metal and a metal alloy,
   wherein the conductive pattern comprises an irregular pattern including an edge structure of continuously connected closed figures, with the closed figures not having the same shape in a predetermined unit area (1 cm×1 cm) in the irregular pattern, and with the number of vertexes of the closed figures being different from the number of vertexes of the same number of quadrangles as the closed figures.

2. The conductive substrate of claim 1, wherein the distance between the nearest-adjacent ends of two or more conductive lines spaced from each other is 10 μm or less.

3. The conductive substrate of claim 1, wherein the distance between the nearest-adjacent ends of two or more conductive lines spaced from each other is 5 μm or less.

4. The conductive substrate of claim 1, comprising:
   a line breakage portion performing breakage at an angle of 80 to 110° in the longitudinal direction of at least one conductive line constituting the conductive pattern.

5. The conductive substrate of claim 1, wherein the conductive pattern comprises one or more selected from the group consisting of Ag, Cu, Cr, Al, Mo, Ni, and a metal alloy.

6. The conductive substrate of claim 1, wherein the conductive pattern comprises an edge structure of continuously connected closed figures, the closed figures having the same shape are not present in the predetermined unit area (1 cm×1 cm) in the conductive pattern, and the number of vertexes of the closed figures is different from the number of vertexes of a polygon formed by connecting shortest distances between centers of gravity of the closed figures.

7. The conductive substrate of claim 1, wherein the conductive pattern comprises an edge structure of continuously connected closed figures, the closed figures having the same shape are not present in the predetermined unit area (1 cm×1 cm) in the conductive pattern, and a value of the following Equation 1 is 50 or more in the closed figures:

(Standard deviation of distances between the vertexes/ Average of the distances between the vertexes)× 100.     [Equation 1]

8. A method of manufacturing the conductive substrate of claim 1, comprising:
   forming a conductive pattern provided on a transparent substrate so that the conductive pattern comprises a line breakage portion performing breakage at an angle of 80 to 110° in a longitudinal direction of at least one conductive line constituting the conductive pattern.

9. The method of manufacturing the conductive substrate of claim 8, wherein the forming of the conductive pattern provided on the transparent substrate is performed by a printing process.

10. A touch panel comprising:
    the conductive substrate according to claim 1.

11. The touch panel of claim 10, wherein a haze value of the touch panel is 10% or less and transmittance is 75% or more.

12. The touch panel of claim 10, wherein the haze value of the touch panel is 5% or less and the transmittance is 85% or more.

13. The touch panel of claim 10, wherein the haze value of the touch panel is 2% or less and the transmittance is 90% or more.

14. A method of manufacturing the conductive substrate of claim 1, comprising:
    forming a conductive pattern provided on a transparent substrate so that the conductive pattern comprises a line breakage portion performing breakage at an angle of 80 to 110° in a longitudinal direction of at least one conductive line constituting the conductive pattern; and
    wherein the printing process is a reverse offset printing process.

* * * * *